(12) United States Patent
Schmid et al.

(10) Patent No.: US 7,049,628 B2
(45) Date of Patent: May 23, 2006

(54) SEMICONDUCTOR MEMORY CELL AND SEMICONDUCTOR MEMORY DEVICE

(75) Inventors: Günter Schmid, Hemhofen (DE); Marcus Halik, Erlangen (DE); Hagen Klauk, Erlangen (DE); Christine Dehm, Nürnberg (DE); Thomas Haneder, Dachau (DE); Thomas Mikolajick, Dresden (DE)

(73) Assignee: Infineon Technologies AG, Munich (DE)

( * ) Notice: Subject to any disclaimer, the term of this patent is extended or adjusted under 35 U.S.C. 154(b) by 48 days.

(21) Appl. No.: 10/395,428

(22) Filed: Mar. 24, 2003

(65) Prior Publication Data
US 2003/0234397 A1    Dec. 25, 2003

(30) Foreign Application Priority Data
Mar. 22, 2002 (DE) ................ 102 12 926

(51) Int. Cl.
*H01L 35/24* (2006.01)
(52) U.S. Cl. ..................... 257/40; 257/295
(58) Field of Classification Search .......... 257/40, 257/295, 310; 438/99
See application file for complete search history.

(56) References Cited

U.S. PATENT DOCUMENTS

| 4,462,090 A | * | 7/1984 | Iizuka ............... 365/185.05 |
|---|---|---|---|
| 4,888,630 A | | 12/1989 | Paterson |
| 5,254,504 A | | 10/1993 | Van der Spiegel et al. |
| 5,365,094 A | * | 11/1994 | Takasu ............... 257/295 |
| 5,523,964 A | | 6/1996 | McMillan et al. |
| 5,812,441 A | | 9/1998 | Manning |
| 6,225,655 B1 | | 5/2001 | Moise et al. |
| 6,627,944 B1 | * | 9/2003 | Mandell et al. ......... 257/315 |
| 6,787,832 B1 | * | 9/2004 | Schmid et al. ......... 257/295 |
| 6,812,509 B1 | * | 11/2004 | Xu ................... 257/295 |

FOREIGN PATENT DOCUMENTS

| EP | 0 298 628 A2 | | 1/1989 |
|---|---|---|---|
| JP | 11-286772 | * | 10/1999 |
| WO | 00/42668 | | 7/2000 |

* cited by examiner

*Primary Examiner*—Sara Crane
(74) *Attorney, Agent, or Firm*—Laurence A. Greenberg; Werner H. Stemer; Ralph E. Locher

(57) ABSTRACT

The semiconductor memory cell is characterized in that at least one modulation region is provided between a first gate electrode of the gate electrode configuration and the insulation region, and in that the modulation region has or is formed from a material or modulation material having electrical and/or further material properties that can be modulated in a controllable manner between at least two states in such a way that, in accordance with these states of the modulation material or of the modulation region, the channel region can be influenced electromagnetically, in particular for a given electrical potential difference between the first gate electrode and the source/drain regions.

56 Claims, 5 Drawing Sheets

SEMICONDUCTOR MEMORY CELL AND SEMICONDUCTOR MEMORY DEVICE

BACKGROUND OF THE INVENTION

Field of the Invention

The invention relates to a semiconductor memory cell having a fieled effect transistor device and to a semiconductor memory device.

In semiconductor memory devices, a multiplicity of semiconductor memory cells are generally configured and interconnected in a very confined space. In many concepts of semiconductor memory cells, the actual memory element is an explicitly formed storage capacitor which is accessed in a controllable manner by an access transistor or a selection transistor in order to read out or alter the storage state of the storage capacitor of the semiconductor memory cell.

The desire for ever higher integration densities and for ever more flexible application possibilities makes it necessary to develop novel concepts of semiconductor memory cells. In particular, the functional separation between storage capacitor on the one hand, and access transistor on the other hand, is associated with a high space requirement.

SUMMARY OF THE INVENTION

It is accordingly an object of the invention to provide a semiconductor memory cell and a semiconductor memory device, which overcome the above-mentioned disadvantages of the prior art apparatus of this general type.

In particular, it is an object of the invention to provide a semiconductor memory cell and a semiconductor memory device that can be used in a particularly space-saving and flexible manner.

With the foregoing and other objects in view there is provided, in accordance with the invention, a semiconductor memory cell including a field-effect transistor device. The field-effect transistor device includes: a first source/drain region, a second source/drain region, a channel region formed between the first source/drain region and the second source/drain region, a gate region having a gate electrode configuration with a first gate electrode, and an insulation region insulating the gate region from the channel region; and at least one modulation region configured between the first gate electrode of the gate electrode configuration and the insulation region. Different information states are detectable and/or representable as different electric currents flowing through the channel region when a given electrical potential difference is applied between the first source/drain region and the second source/drain region. The modulation region includes modulation material having at least two states. The modulation region is controllably modulatable between the states to electromagnetically influence the channel region, in accordance with the states, for a given electrical potential difference applied between the first gate electrode and the first and second source/drain regions. The modulation material of the modulation region enables a capacitance modulation.

The semiconductor memory cell of the generic type has a field-effect transistor device. The field-effect transistor device has a first and a second source/drain region with a channel region formed in between, and also a gate region with a gate electrode configuration insulated therefrom by an insulation region. In the semiconductor memory cell of the generic type, different information states can be detected and/or represented as electric currents flowing for a given electrical potential difference between the source/drain regions via the channel region.

The semiconductor memory cell is characterized in that at least one modulation region is provided between a first gate electrode of the gate electrode configuration and the insulation region, and in that the modulation region has or is formed from a material or modulation material having electrical and/or further material properties that can be modulated in a controllable manner between at least two states in such a way that, in accordance with these states of the modulation material or of the modulation region, the channel region can be influenced electromagnetically, in particular for a given electrical potential difference between the first gate electrode and the source/drain regions.

Consequently, a central idea of the present invention is to electromagnetically influence the channel region of the field-effect transistor device. In particular, for example, for a given constant electrical potential difference between the first gate electrode, the gate electrode configuration and the source/drain regions, at least one modulation region with a modulation material is provided between the first gate electrode of the gate electrode configuration and the insulation region. The electromagnetic influencing becomes controllable by virtue of the fact that the electrical and/further material properties of the modulation material can be modulated in a controllable manner, in particular between at least two states that differ from one another. This means that, for example, in accordance with a first state of the modulation region, for a given potential difference between the first gate electrode and the source/drain regions, an electromagnetic influencing of a first intensity is exerted, whereas, after the modulation of the modulation material toward the second state, the channel region can be influenced electromagnetically with a second intensity that differs from the first intensity.

Ultimately, the information content of the memory cell is defined by the respective state of the modulation material. In this case, a multiplicity of modulation states are also conceivable, in principle, so that more than two states and hence, more than one binary bit can be stored in a given memory cell.

By virtue of the configuration, the storage capacitor is formed in an integrated fashion with the selection transistor. The modulation of the properties of the modulation material corresponds to a corresponding capacitance modulation and, consequently, to a modulation of the electric field strength, in particular in the channel region, as a result of which the latter is influenced electromagnetically.

In accordance with a particularly preferred embodiment of the semiconductor memory cell, the electrical conductivity of the channel region is controllable by the states of the modulation region and, in particular, of the modulation material and/or by the corresponding state changes. The modulation or change of the electrical conductivity of the channel region connecting the source/drain regions influences and modulates the measurement signal that is necessary for sensing the information state contained in the cell, namely the current flowing in the channel. In this case, ultimately the states of the modulation region are unambiguously assigned to the channel current intensities.

In another embodiment of the semiconductor memory cell, different electric field strengths and/or electrical potentials can be applied to the channel region by the states of the modulation region and, in particular, of the modulation material and/or by the state changes.

It is possible to vary a multiplicity of properties with regard to the modulation region and, in particular, with regard to the modulation material by external influencing. In particular, it is conceivable to form the modulation material such that it can be modulated with regard to its specific electrical conductivity, its dielectric properties, its polarization properties and/or the like.

The influencing of the modulation region or the modulation material and the properties thereof can be effected by thermal, electrical, magnetic, electromagnetic influencing and/or the like. Materials exist whose electrical conductivity or dielectric constant is switchable by the application of a suitable electrical pulse. It is possible to effect e.g. an influencing by the current flow, then e.g. by means of the corresponding heating, which leads to a phase transformation, e.g. between crystalline and amorphous phases. Shifting Redox equilibria and/or the like is also a promising possibility as a process taken as a basis for the modulation.

In principle, the above-specified configuration with two source/drain regions, a channel region provided in between, and a gate region with a first gate electrode insulated therefrom is sufficient for the semiconductor memory cell. However, in accordance with a further embodiment of the semiconductor memory cell, it is also conceivable to provide a second gate electrode. The latter then enables the further targeted influencing both of the properties of the modulation region and of the modulation material and of the channel region itself.

It is particularly advantageous if the second gate electrode is provided between the insulation region and the modulation region or the modulation material.

In a further embodiment, the second gate electrode is formed directly adjacent to and/or directly adjoining the insulation region.

In accordance with another embodiment of the semiconductor memory cell, the modulation region and in particular the modulation material is formed directly or immediately between the first gate electrode and the second gate electrode. What is formed in this case, as it were, is a layer sequence including a first gate electrode, modulation material and second gate electrode. By virtue of this configuration, the state of the modulation region and of the modulation material provided therein can be set and chosen particularly carefully.

In accordance with another embodiment, the second gate electrode is formed as a free gate electrode or as a so-called floating gate.

In principle, the channel region is continuously influenced by the properties of the modulation region and the envisaged electrical potential difference between the first gate electrode and the source/drain regions. However, situations are conceivable in which a memory cell is not intended to be enabled for access, to be precise without having to change the potential difference between the first gate electrode and the source/drain regions, which, moreover, might have the effect that this could also change the properties of the modulation region and of the modulation material provided therein, which is undesirable. For this case, it is particularly advantageous if a third gate electrode is provided in direct lateral proximity to the second gate electrode as a control electrode. The additional control electrode in the form of a third gate electrode can then be used in order to additionally apply an electrical potential difference or an electric field to the channel region between the source/drain regions of the field-effect transistor device in such a way that the channel path is interrupted, for example, even when the channel region would actually be turned on because of the electrical potential difference applied between the first gate electrode and the source/drain regions. The electrical potential difference or the electric field between the third gate electrode and the source/drain regions then largely does not influence the modulation region and the modulation material provided there, so that the information state in the semiconductor memory cell is not influenced despite the field-effect transistor device being switched off.

In accordance with another embodiment of the semiconductor memory cell, an electrically insulating dielectric layer is provided between the second and optionally provided third gate electrode, on the one hand, and the insulation region or gate insulation region, on the other hand.

A particularly simple embodiment of the semiconductor memory cell is produced if the modulation material can assume or has a first high-impedance state and a second low-impedance state.

In order to realize the modulatable material properties and thus the control of the channel region, various substantive embodiments are conceivable for the modulation region and the modulation material provided therein.

The modulation region may be formed either from an organic or from an inorganic material or from materials of this type.

Appropriate inorganic materials are chalcogenides, which serve as phase transformation material. Furthermore, solid-state ionic conductors which contain a suitable metal are conceivable.

Monolayers or films of finite thickness are appropriate in the case of the organic materials. In particular, layers based on bispyridinium or based on TCNQ and the organometallic compounds thereof, for example Cu/TCNQ, are particularly suitable.

For the optionally provided gate dielectric, too, various materials or material combinations are provided, for example inorganic compounds, in particular including silicon dioxide, silicon nitride, aluminum oxide, zinc oxide, hafnium oxide and/or the like and/or mixtures and/or compounds thereof.

Organic compounds are also conceivable, in particular polymers, polystyrene, polyethylene, polyester, polyurethane, polycarbonate, polyacrylate, polyimide, polyether, polybenzoxazoles and/or the like and/or mixtures or compounds thereof.

For the source/drain regions, the gate electrodes and/or the respective leads, appropriate materials are metals, for example, palladium, gold, platinum, nickel, copper, titanium and/or the like. Doped inorganic and/or organic semiconductors, for example camphorsulfonic-acid-doped polyanalines, polystyrene-sulfonic-acid-doped polythiophenes and/or the like or mixtures or compounds thereof are also conceivable.

Semiconductor memory cells which have the inventive structure and in which a field-effect transistor based on an organic semiconductor material is used as field-effect transistor device are particularly suitable for modern applications.

In this case, it is particularly suitable for the channel region to have or to be formed from an organic semiconductor material. In this case, it is particularly advantageous that what is provided as organic semiconductor material, in particular as p-type semiconductor, is a material based on condensed aromatic compounds, in particular based on anthracene, tetracene, pentacene, based on polythiophene, for example, poly-3-alkylthiophene, polyvinylthiophene, or based on organometallic complexes, for example, using copper, of phthalocyanine or porphyrin.

It is furthermore advantageous to provide a flexible, substrate, in particular using metals, for example copper, nickel, gold, iron sheet and/or the like, plastics, for example polystyrene, polyethylene, polyester, polyurethane, polycarbonate, polyacrylate, polyimide, polyether, polybenzoxazole and/or the like, paper and/or the like.

A further aspect of the present invention is the provision of a semiconductor memory device which is characterized by a plurality of the inventive memory cells.

In this case, various contact connections of the respective source/drain regions and/or gate regions may be provided.

In accordance with a particularly advantageous development of the semiconductor memory device, the source/drain regions and/or the gate regions of a given semiconductor memory cell are connected to other semiconductor memory cells of the semiconductor memory device, preferably in a matrix configuration, by directly connecting the respective conductive regions.

As an alternative or in addition, the connection of a given semiconductor memory cell of the semiconductor memory device with regard to the source/drain regions and/or the gate regions to other cells of the semiconductor memory device is realized by an additional metal track or metallization and optionally provided corresponding contacts.

The above-described and further aspects of the present invention emerge from the observations below:

Electronics based on organic or organometallic compounds is discussed for applications, e.g. ID tags, smart cards, etc., which need have a lower performance in comparison with chips fabricated from silicon. The price permitted for these systems can no longer be achieved by silicon-based electronics. Logic circuits based on organic semiconductors have already been successively demonstrated many times.

In the material development of volatile or nonvolatile memories based on organic polymers and molecules (also organometallic), promising materials are those based on bispyridinium derivatives, chalcogenides or organometallic complexes which have two or more different conductivity states. This invention describes, inter alia, a component that includes a memory cell with a selection transistor and can be integrated in circuits with organic semiconductors.

This yields, for example, the following advantages and aspects:

the possibility of changing the conductivity, in particular in the organic or organometallic substances based on bispyridinium or organometallic complexes, is utilized to construct a polymer-based rewritable or write-once, nonvolatile memory element;

the component inherently contains a built-in transistor function;

the gate electrode of the selection transistor and an electrode of the memory cell are fabricated in one step, if appropriate;

the gate may be divided, if appropriate, in order to obtain an additional control input for ensuring that the non selected cells do not contribute to the current flow during reading in a matrix configuration;

the operating point of the memory cell can be adapted to the polymer-based transistors by varying the layer thickness and the material (1–50 V, preferably 5–15 V);

the size of the memory cell is non critical since it is formed on inexpensive substrate material (polymer films, paper) and the price is not determined by the chip size;

the signal swing for read/write can be controlled by the size of the memory cell, i.e. scaling problems do not occur (1–100 µm$^2$);

the non destructive read-out is effected via the state of the integrated transistor (ON-OFF); and writing is effected using the capacitor/gate electrodes.

One inventive idea resides in the construction of an integrated transistor that contains a capacitor-like cell, whose conductivity can be changed.

In one form of the memory cell, the memory cell has gate electrodes and a conductivity-modulatable material in between. One electrode simultaneously forms the outer gate electrode of the field-effect transistor constructed above that. The further components of the transistor are formed by a gate dielectric, the source electrode and the drain electrode. The channel is formed between the source and drain at the interface between an organic semiconductor and the gate dielectric. By dividing the gate electrode, it is possible to integrate an additional control input into the component.

The functioning of the component is explained below:

Assumption: The conductivity modulation material shall be at a high impedance in the basic state and is modulated in its conductivity only between the electrodes. In order to explain the functioning, it is furthermore assumed that the organic semiconductor is formed from the p-type channel material pentacene. If the conductivity-modulatable material is in the high-impedance state, then the transistor sees an area-related input capacitance $\in 1/d1+d2*(\in 1/\in 2))$. Here d1, d2 are the thicknesses of the gate dielectric and of the conductivity modulation layer, respectively, of the field-effect transistor, and $\in 1$ and $\in 2$ are the dielectric constants of the gate dielectric and of the conductivity modulation layer, respectively. When a specific voltage, e.g. VDD, is applied to the outer electrode of the capacitor, the inner electrode remaining floating, a current of magnitude I1 thus flows through the transistor.

In contrast, if the conductivity-modulating material is in the low-impedance state, then the transistor sees an area-related input capacitance of only $\in 1/d1$, where d1 is the thickness of the gate dielectric of the field-effect transistor. When a specific voltage, e.g. -VDD, is applied to the outer electrode of the capacitor, the inner electrode remains floating, and a current of magnitude I2>I1 thus flows through the transistor. The difference between I1 and I2 becomes greater, the larger $\in 1$ and the smaller d1, and the lower $\in 2$ and the larger d2.

By applying suitable current or voltage pulses to the gate electrodes, the material can be switched back and forth between the high- and low-impedance states.

In a further embodiment, the current flow through non selected cells in a matrix configuration can be suppressed independently of the state of the conductivity-modulating material.

In addition, by using a suitable material, the configurations are suitable as multilevel memories. Depending on the region in which the dielectric constant of the capacitor can be altered, it is possible to set a plurality of states. In this way, more than one bit can be stored in a memory cell and a multilevel memory element can thus be realized.

The following materials are conceivable:

The substrate materials used are highly diverse. Examples that may be mentioned here are flexible films made of metal (copper, nickel, gold, iron sheet, etc.), plastics (polystyrene, polyethylene, polyester, polyurethanes, polycarbonates, polyacrylates, polyimides, polyether, polybenzoxazoles, etc.) or paper. Suitable organic semiconductors are the p-type semiconductors based on the condensed aromatic compounds (anthracene, tetracene, pentacene), polythiophene (poly-3-alkylthiophene, polyvinylthiophene), polypyrroles or the organometallic complexes (Cu) of phthalocyanine or porphyrin.

Organic and inorganic compounds whose conductivity or dielectric constant can be electrically altered in a wide range are appropriate as a modulation material between the two gate electrodes. In particular, monolayers or films of finite thickness based on bispyridinium or TCNQ are particularly suitable, but so are inorganic materials such as chalcogenides.

The gate dielectrics may be either of inorganic or of organic nature. The integration of the inorganic dielectric silicon dioxide, silicon nitride, aluminum oxide, zinc oxide, hafnium oxide and/or the like is conceivable. As organic materials, polystyrene, polyethylene, polyester, polyurethanes, polycarbonates, polyacrylates, polyimides, polyether, polybenzoxazoles are particularly suitable because of their potential printability.

For the fabrication of the electrodes and connecting lines between the cells and transistors, metals (Pd, Au, Pt, Ni, Cu, Ti, etc.) are suitable because of their low non reactive resistance. For less stringent demands, it is also possible to use organic doped semiconductors such as camphorsulfonic-acid-doped polyaniline and polystyrenesulfonic-acid-doped polythiophenes.

Other features which are considered as characteristic for the invention are set forth in the appended claims.

Although the invention is illustrated and described herein as embodied in a semiconductor memory cell and semiconductor memory device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In FIGS. 1 to 4 below, identical reference symbols always designate identical. structures and functional elements, and a detailed description is not given or repeated each time they occur. The substrate is situated in each case below the configuration shown and is not illustrated in each case.

Figure 1:
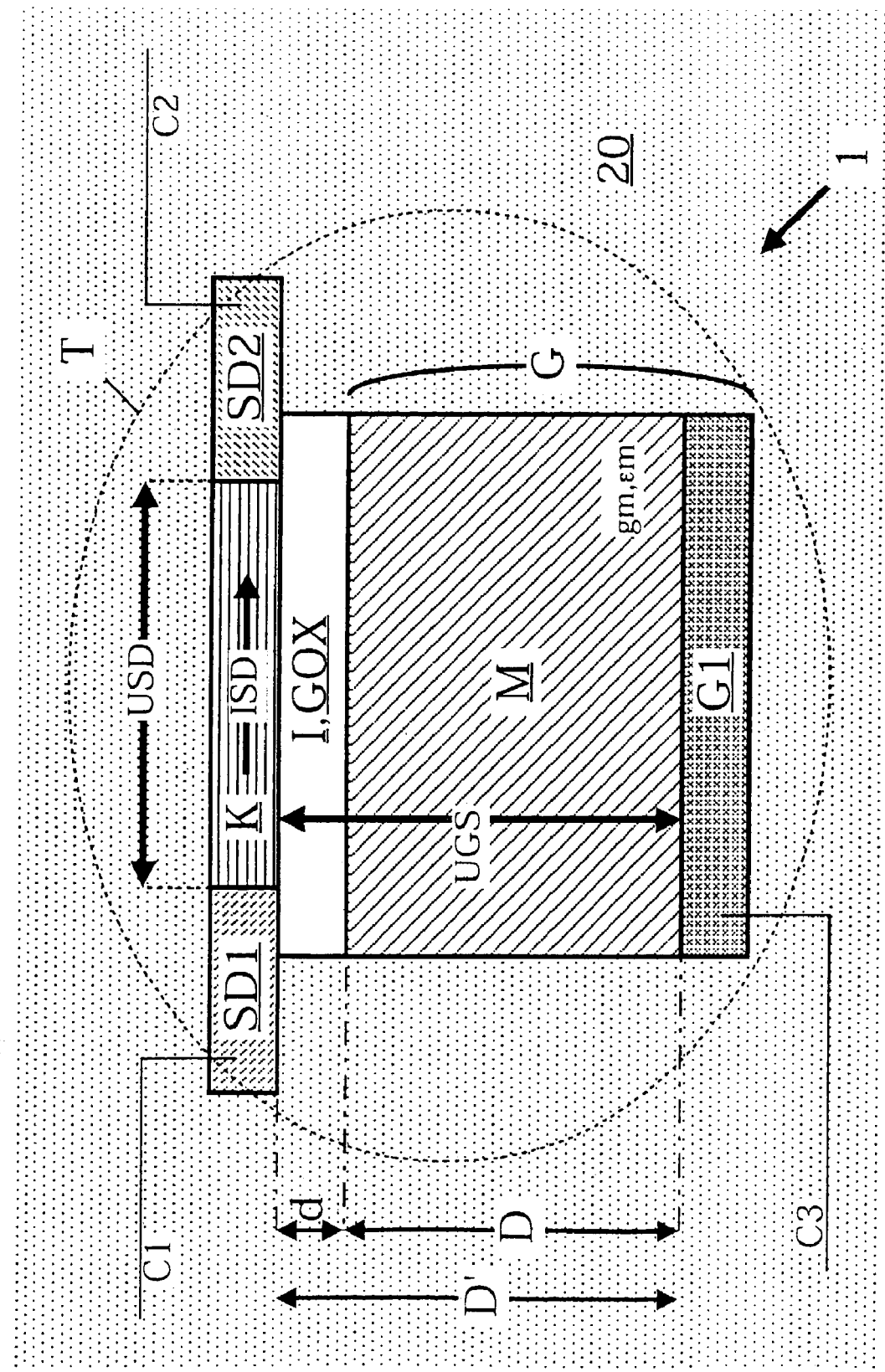
FIGS. 1–3 show sectional side views of different embodiments of an inventive semiconductor memory cell.

Referring now to the figures of the drawing in detail and first, particularly, to FIG. 1 thereof, there is shown a lateral cross-sectional view of a first embodiment of the inventive semiconductor memory cell 1.

In the exemplary embodiment shown in FIG. 1, a field-effect transistor device T is formed in an essentially electrically insulating material region 20. The device includes two source/drain regions SD1 and SD2, between which a channel region K is provided.

The configuration of the field-effect transistor device is provided on a substrate region that is not illustrated. The possible substrate materials are highly diverse. By way of example, it is possible to use flexible films made of metal, for example, made of copper, nickel, gold, iron sheet, etc., made of plastics, for example, polystyrene, polyethylene, polyester, polyurethane, polycarbonate, polyacrylate, polyimide, polyether, polybenzoxazole, etc., but also made of paper. When conductive materials are used, it is necessary to provide an additional insulating layer made of inorganic or organic dielectrics. In this case, appropriate inorganic dielectrics are once again silicon dioxide, silicon nitride, aluminum oxide, zinc oxide, hafnium oxide and/or the like. Polystyrene, polyethylene, polyester, polyurethanes, polycarbonates, polyacrylates, polyimides, polyether, polybenzoxazoles and/or the like are conceivable as organic dielectrics.

An insulation region I, for example, a gate oxide region GOX having the thickness d, is formed below the configuration including the first source/drain region SD1, the channel region K and the second source/drain region SD2. Situated below the insulation region I is the modulation region M having the thickness D, which may be bounded laterally by the extent of the source/drain regions SD1, SD2 and the channel region K provided in between, or else be applied over the whole area. The geometrical configuration may also be upside down, in principle.

The modulation region M has a modulation material which, in the exemplary embodiment shown in FIG. 1, can assume a first high-impedance conductivity state having a specific conductivity gm with a first value gm1 and a second low-impedance conductivity state having a specific conductivity gm with a second value gm2: $0 \leq gm1 << gm2$.

The first gate electrode G1 or outer gate electrode G1 of the gate electrode configuration GE is provided directly below the modulation region M. The modulation region M, together with the first or outer gate electrode G1, forms the gate configuration G of the semiconductor memory cell 1.

The source/drain regions SD1, SD2 and the first gate electrode G1 can be electrically connected externally via respective contacts, indicated diagrammatically here by C1, C2 and C3, respectively. The contact connection of the source/drain regions SD1, SD2 and gate regions generally depends on the architecture of the chosen memory matrix. Particular preference is attached to configurations in which as many cells as possible are connected to one another in a suitable manner by source/drain and gate regions that are continuously connected to one another. The contact connection is then effected at the edge of the memory matrix. However, a wiring with additional lines is also conceivable.

For consideration below, the conductivity of the material of the modulation region shall be switchable. During the operation of the embodiment of FIG. 1, in a first operation state, then, the material of the modulation region M shall have the value gm1 for the specific conductivity gm. A voltage UGS1 shall then be applied to the gate electrode G1, which voltage does not influence the modulation material M. On account of the high impedance or low conductivity gm of the material of the modulation region M, the entire applied gate/source voltage UGS of the value UGS1 is dropped across the modulation region M and the insulation region GOX, that is to say over a total layer thickness $D'=D+d$. Accordingly, in the region of the channel K, the field strength assumes approximately a value $E1=UGS1/(D+d)$, that is to say a comparatively low field strength value at which the channel K has a low conductivity and thus carries a source/drain current ISD with a small value ISD1.

By the application of a suitable current or voltage pulse, the modulation material M is then switched into the low-impedance state, that is to say the following then holds true: gm2>>gm1. This would correspond to a low-impedance conductivity state. Consequently, the modulation region M thus forms, as it were, an extension of the first gate electrode G1. The entire applied gate/source voltage UGS of the value UGS2 is thus dropped across the comparatively small layer thickness d of the insulation region I, GOX having the thickness d, so that a very much greater electric field strength E of the value E2=UGS2/d>>E1 is impressed on the channel region K, as a result of which the channel region K thus has a very much higher channel conductivity and thus carries a very much larger channel current I2>>I1.

In this way, through the modulation of the specific electrical conductivity gm of the modulation region M to values gm1<<gm2, a storage of two states can be effected and then also measured in accordance with the current values ISD1<<ISD2.

Figure 2:
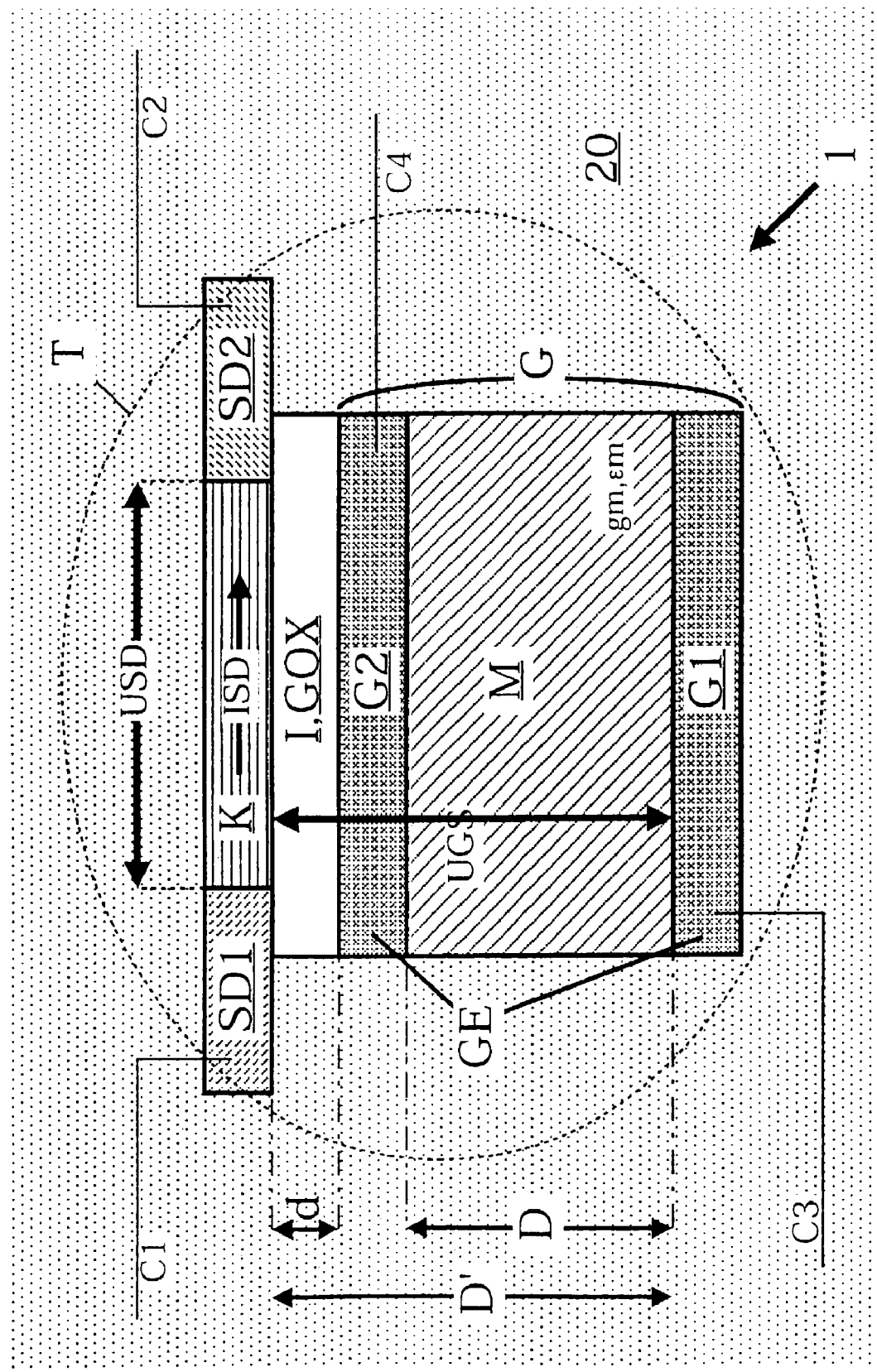

FIG. 2 shows an extension of the embodiment of FIG. 1, in which a second gate electrode G2 of the gate electrode configuration GE of the gate region G is configured directly below the insulation region I, GOX and directly above the modulation region M. This electrode G2 is contact-connected at the edge of the memory matrix or by contacts. The modulation of the conductivity gm of the modulation region M can then be controlled better by using this additional second gate electrode G2. If appropriate, a contact device, indicated diagrammatically here by C4, for contact-connecting the second gate electrode G2 may also be eliminated, so that the second gate electrode G2 acts as a floating gate.

Figure 3:
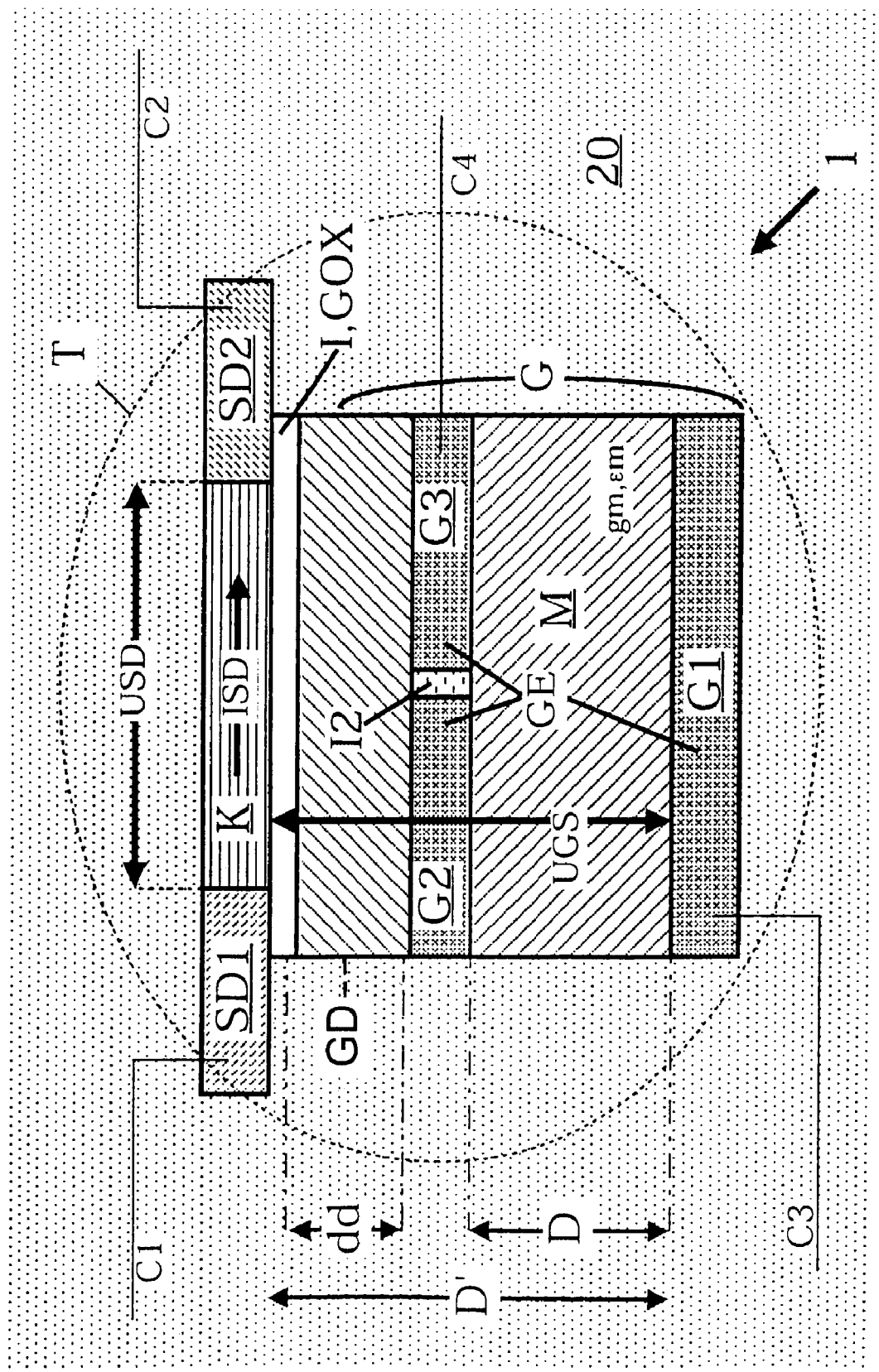

In the embodiment shown in FIG. 3, a spacing dd is formed between the second gate electrode G2 and the insulation region I, GOX. The inter space is provided with a so-called gate dielectric GD having a dielectric constant $\in d$, and having a layer thickness dd.

In the embodiment of FIG. 3, the second gate electrode G2 performs the same function as in FIG. 2, that is to say it may be formed as a floating gate, or be contact-connected at the matrix edge or directly. A third gate electrode G3 is provided laterally, if appropriate slightly spatially at a distance from the second gate electrode G2 and is electrically insulated from the latter. The third gate electrode G3 is electrically contact-connected externally at the matrix edge or directly with the corresponding further contact, as is indicated diagrammatically here by C4. The second gate electrode G2 fulfills the function described above, while the independent third gate electrode G3 is formed for controlling the channel region K independently of the storage state in accordance with the material properties of the modulation region M, without the modulation region M being critically influenced in the process.

The modulation region M having a layer thickness D and a dielectric constant $\in m$ is once again provided between the first gate electrode G1 and the second gate electrode and/or third gate electrode G2, G3.

Figure 4:
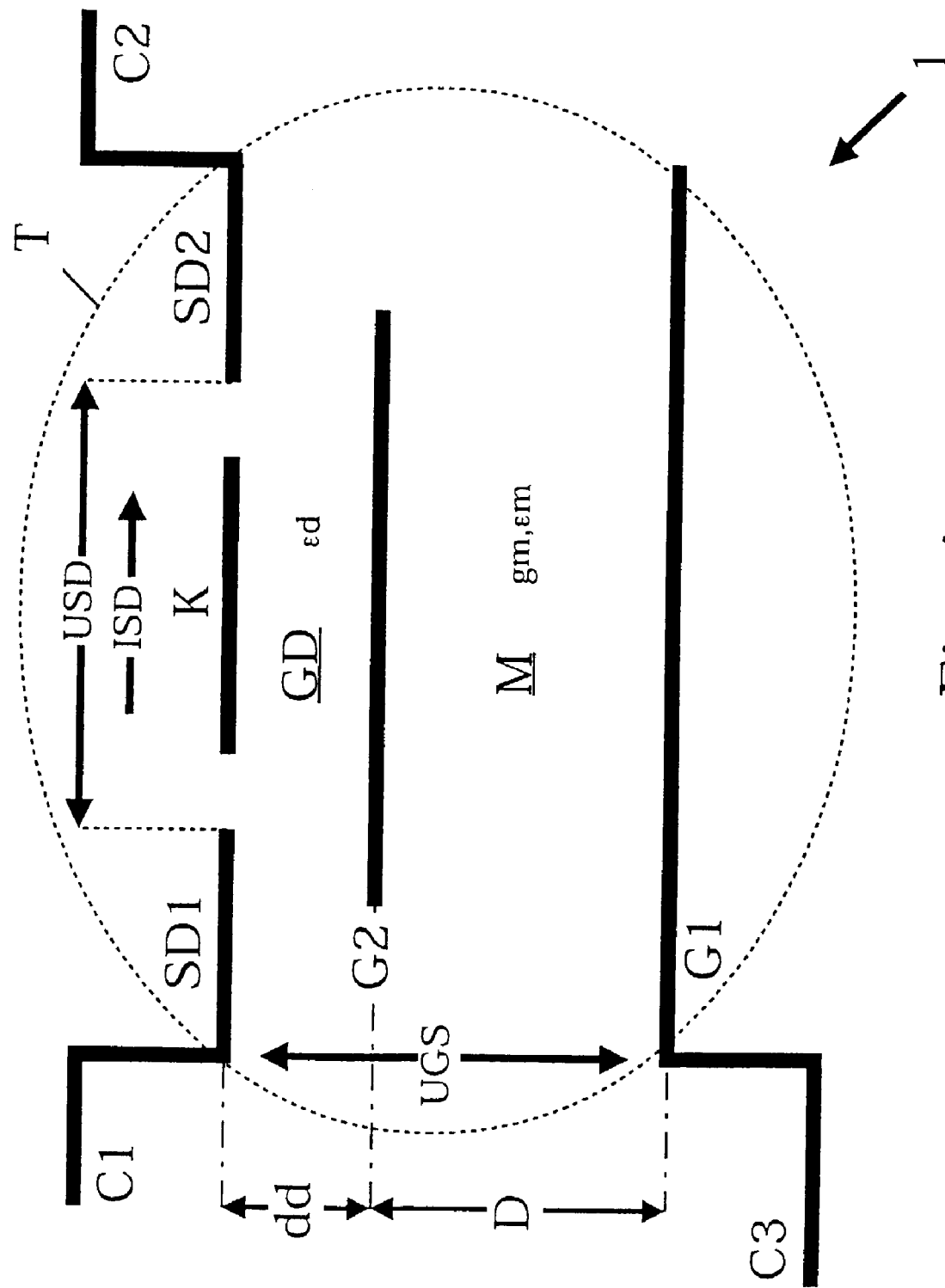
FIG. 4 shows an equivalent circuit diagram relating to the embodiment shown in FIG. 3.
Figure 5:
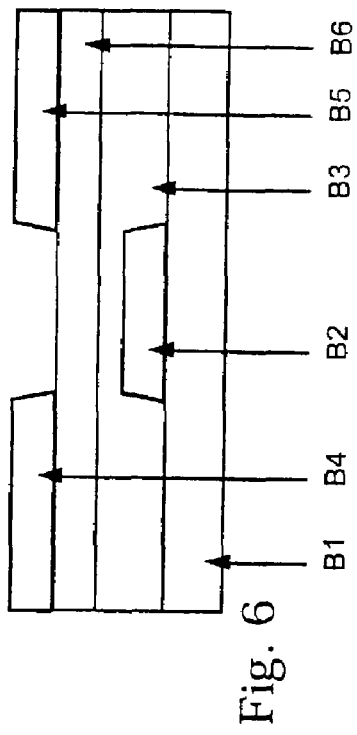
FIGS. 5–10 show six different structures of field-effect transistor devices using organic semiconductor materials.
Figure 6:
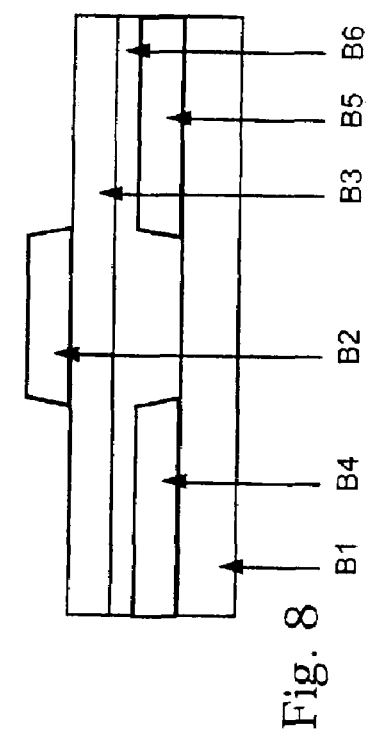
Figure 7:
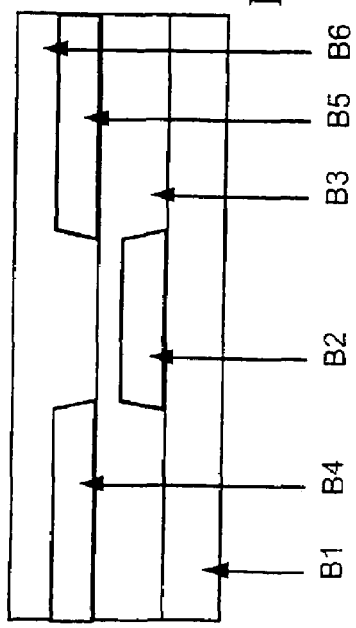
Figure 8:
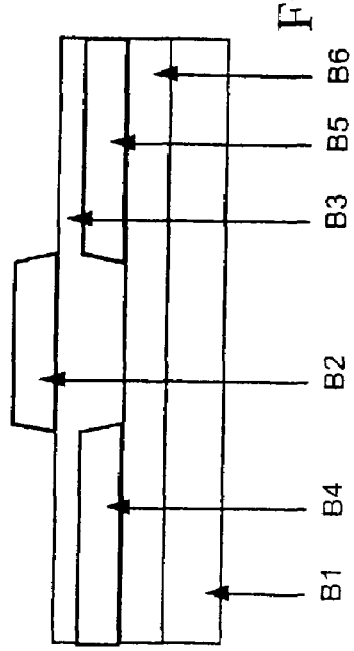
Figure 9:
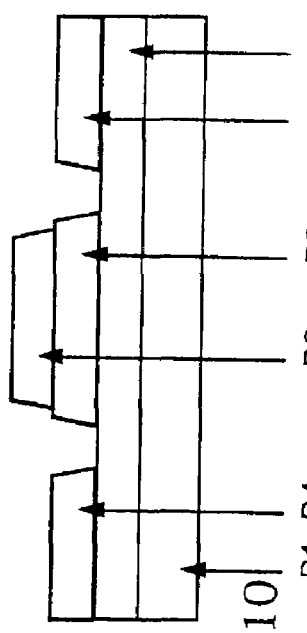
Figure 10:
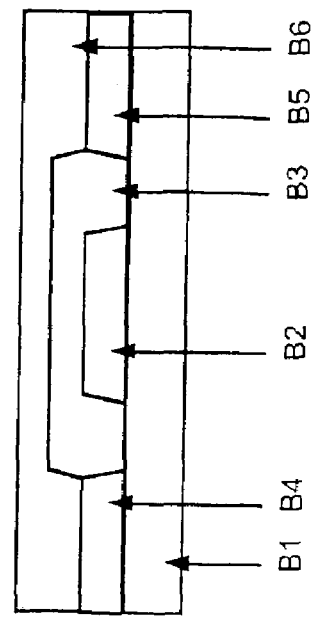

FIG. 4 shows an equivalent circuit diagram of the embodiment of FIG. 3 with omission of the third gate electrode G3. The layer thicknesses of the second gate electrode and of the gate oxide GOX additionally have been disregarded.

In the high-impedance state gm=gm1, it emerges from the configuration of FIG. 4 that the total layer thickness D'=D+dd and, consequently, the serially added capacitances of the modulation region M and of the gate dielectric GD take effect with respect to the channel region K. This total serial capacitance corresponds in area-specific form to the value $\in d^* \in m/(D^* \in d + dd^* \in m)$.

In the low-impedance conductivity state gm=gm2, the interface of the gate/source capacitance arises directly at the interface toward the second gate electrode G2. Consequently, it is essentially exclusively the gate dielectric layer GD that takes effect, so that the channel region K sees the specific capacitance $\in d/dd$ in the low-impedance conductivity state of the modulation layer M.

Consequently, in the second case, the electromagnetic influencing of the channel region K on account of the higher field strength is very much greater than in the high-impedance conductivity state of the modulation region M, so that the following relation holds true for the current flow ISD2 in the second case and ISD1 in the first case: ISD2>>ISD1.

FIGS. 5 to 10 show sectional side views of field-effect transistor devices based on the present invention using organic semiconductor materials. The same reference symbols always designate the same or identically acting elements in all of the figures.

The gate electrode B2, the gate dielectric layer B3, the source contact B4, the drain contacts B5 and the organic semiconductor layer B6 are in each case deposited successively in a corresponding order onto a suitable substrate B1 and are patterned in accordance with the required topological properties.

We claim:

1. A semiconductor memory cell including a field-effect transistor device based on organic semiconductor material, the field-effect transistor device comprising:
   a first source/drain region, a second source/drain region, a channel region formed between said first source/drain region and said second source/drain region, a gate region having a gate electrode configuration with a first gate electrode, and an insulation region insulating said gate region from said channel region, said channel region having or being formed from an organic semiconductor material; and
   at least one modulation region configured between said first gate electrode of said gate electrode configuration and said insulation region;
   different information states being detectable and/or representable as different electric currents flowing through said channel region when a given electrical potential difference is applied between said first source/drain region and said second source/drain region;
   said modulation region including modulation material having at least two states;
   said modulation region being controllably modulatable between said states to electromagnetically influence said channel region, in accordance with said states, for a given electrical potential difference applied between said first gate electrode and said first and second source/drain regions; and
   said modulation material of said modulation region enabling a capacitance modulation, said modulation material having a modulatable property selected from a group consisting of a specific electrical conductivity, a dielectric property, and a polarization property.

2. The semiconductor memory cell according to claim 1, wherein said channel region has an electrical conductivity that is controllable by said states of said modulation material and/or by changes of said states of said modulation material.

3. The semiconductor memory cell according to claim 1, wherein different electric field strengths and/or electrical potential differences are applied to said channel region by said states of said modulation material and/or by changes of said states of said modulation material.

4. The semiconductor memory cell according to claim 1, wherein said modulation material has a property that can be modulated by a thermal exposure, electrical exposure, magnetic exposure, and/or electromagnetic exposure.

5. The semiconductor memory cell according to claim 1, further comprising a second gate electrode.

6. The semiconductor memory cell according to claim 5, wherein said second gate electrode is configured between said insulation region and said modulation region or between said insulation region and said modulation material.

7. The semiconductor memory cell according to claim 5, wherein said second gate electrode is configured directly adjacent said insulation region.

8. The semiconductor memory cell according to claim 5, wherein said modulation material is configured directly or immediately between said first gate electrode and said second gate electrode.

9. The semiconductor memory cell according to claim 5, wherein said modulation region is configured directly or immediately between said first gate electrode and said second gate electrode.

10. The semiconductor memory cell according to claim 5, wherein said second gate electrode is formed as a free gate electrode or as a floating gate.

11. The semiconductor memory cell according to claim 5, further comprising a third gate electrode configured as a control electrode located directly laterally proximal to said second gate electrode.

12. The semiconductor memory cell according to claim 11, further comprising an electrically insulating gate dielectric region configured between said third gate electrode and said insulation region.

13. The semiconductor memory cell according to claim 5, further comprising an electrically insulating gate dielectric region configured between said second gate electrode and said insulation region.

14. The semiconductor memory cell according to claim 1, wherein said modulation region has a first high-impedance state and a second low-impedance state.

15. The semiconductor memory cell according to claim 1, wherein said modulation material has a first high-impedance state and a second low-impedance state.

16. The semiconductor memory cell according to claim 1, wherein said modulation material includes an organic compound and/or an inorganic compound.

17. The semiconductor memory cell according to claim 1, wherein said modulation material is formed as a monolayer of an organic compound and/or an inorganic compound.

18. The semiconductor memory cell according to claim 1, wherein said modulation material includes an organic compound based on a material selected from a group consisting of bispyridinium, TCNQ, an organometallic compound of bispyridinium, and an organometallic compound of TCNQ.

19. The semiconductor memory cell according to claim 1, wherein said modulation material includes Cu/TCNQ.

20. The semiconductor memory cell according to claim 1, wherein said modulation material includes inorganic modulation material selected from a group consisting of chalcogenides and solid-state ionic conductors including a metal.

21. The semiconductor memory cell according to claim 1, further comprising a gate dielectric including an inorganic compound and/or an organic compound.

22. The semiconductor memory cell according to claim 1, further comprising a gate dielectric formed from an inorganic compound and/or an organic compound.

23. The semiconductor memory cell according to claim 1, further comprising a gate dielectric including an organic material selected from a group consisting of polymers, polystyrene, polyethylene, polyester, polyurethane, polycarbonate, polyacrylate, polyimide, polyether, polybenzoxazoles, mixtures thereof, and compounds thereof.

24. The semiconductor memory cell according to claim 1, further comprising a gate dielectric including an inorganic material selected from a group consisting of silicon dioxide, silicon nitride, aluminum oxide, zinc oxide, hafnium oxide, mixtures thereof, and compounds thereof.

25. The semiconductor memory cell according to claim 1, wherein at least one element selected from a group consisting of said first source/drain region, said second source/drain region, and said first gate electrode includes or is formed from a metal.

26. The semiconductor memory cell according to claim 25, wherein said metal is selected from a group consisting of palladium, gold, platinum, nickel, copper, titanium, mixtures thereof, and compounds thereof.

27. The semiconductor memory cell according to claim 1, comprising at least one lead including a metal selected from a group consisting of palladium, gold, platinum, nickel, copper, titanium, mixtures thereof, and compounds thereof.

28. The semiconductor memory cell according to claim 1, wherein at least one element selected from a group consisting of said first source/drain region, said second source/drain region, and said first gate electrode includes or is formed from a doped semiconductor material.

29. The semiconductor memory cell according to claim 28, wherein said doped semiconductor material includes an inorganic and/or organic semiconductor material selected from a group consisting of camphorsulfonic-acid-doped polyanilines, polystyrenesulfonic-acid-doped polythiophenes, mixtures thereof, and compounds thereof.

30. The semiconductor memory cell according to claim 1, comprising at least one lead including a doped inorganic and/or organic semiconductor material.

31. The semiconductor memory cell according to claim 30, wherein said doped semiconductor material is selected from a group consisting of camphorsulfonic-acid-doped polyanilines, polystyrenesulfonic-acid-doped polythiophenes, mixtures thereof, and compounds thereof.

32. The semiconductor memory cell according to claim 1, wherein said organic semiconductor material is a p-type semiconductor material.

33. The semiconductor memory cell according to claim 1, wherein said organic semiconductor material is based on a condensed aromatic compound.

34. The semiconductor memory cell according to claim 33, wherein said condensed aromatic compound is selected from a group consisting of anthracene, tetracene, and pentacene.

35. The semiconductor memory cell according to claim 1, wherein said organic semiconductor material is based on polythiophene.

36. The semiconductor memory cell according to claim 35, wherein said polythiophene is selected from a group consisting of poly-3-alkylthiophene and polyvinylthiophene.

37. The semiconductor memory cell according to claim 1, wherein said organic semiconductor material is based on an organometallic complex.

38. The semiconductor memory cell according to claim 37, wherein said organometallic complex uses a copper of phthalocyanine or porphyrin.

39. The semiconductor memory cell according to claim 1, wherein said organic semiconductor material is a p-type semiconductor material.

40. The semiconductor memory cell according to claim 1, wherein said organic semiconductor material is based on a condensed aromatic compound.

41. The semiconductor memory cell according to claim 40, wherein said condensed aromatic compound is selected from a group consisting of anthracene, tetracene, and pentacene.

42. The semiconductor memory cell according to claim 1, wherein said organic semiconductor material is based on polythiophene.

43. The semiconductor memory cell according to claim 42, wherein said polythiophene is selected from a group consisting of poly-3-alkylthiophene and polyvinylthiophene.

44. The semiconductor memory cell according to claim 1, wherein said organic semiconductor material is based on an organometallic complex.

45. The semiconductor memory cell according to claim 44, wherein said organometallic complex uses a copper of phthalocyanine or porphyrin.

46. The semiconductor memory cell according to claim 1, further comprising a flexible substrate.

47. The semiconductor memory cell according to claim 46, wherein said flexible substrate includes at least one metal selected from a group consisting of nickel, gold, and iron sheet.

48. The semiconductor memory cell according to claim 46, wherein said flexible substrate includes at least one plastic selected from a group consisting of polystyrene, polyethylene, polyester, polyurethane, polycarbonate, polyacrylate, polyimide, polyether, and polybenzoxazole.

49. The semiconductor memory cell according to claim 46, wherein said flexible substrate includes paper.

50. A semiconductor memory device including a plurality of memory cells, each one of the plurality of memory cells including a field-effect transistor device based on organic semiconductor material, the field-effect transistor device comprising:
  a first source/drain region, a second source/drain region, a channel region formed between said first source/drain region and said second source/drain region, a gate region having a gate electrode configuration with a first gate electrode, and an insulation region insulating said gate region from said channel region, said channel region having or being formed from an organic semiconductor material; and
  at least one modulation region configured between said first gate electrode of said gate electrode configuration and said insulation region;
  different information states being detectable and/or representable as different electric currents flowing through said channel region when a given electrical potential difference is applied between said first source/drain region and said second source/drain region;
  said modulation region including modulation material having at least two states;
  said modulation region being controllably modulatable between said states to electromagnetically influence said channel region, in accordance with said states, for a given electrical potential difference applied between said first gate electrode and said first and second source/drain regions; and
  said modulation material of said modulation region enabling a capacitance modulation, said modulation material having a modulatable property selected from a group consisting of a specific electrical conductivity, a dielectric property, and a polarization property.

51. The semiconductor memory device according to claim 50, wherein said first source/drain region of one of said plurality of said memory cells is connected to said first source/drain region of other ones of said plurality of said memory cells.

52. The semiconductor memory device according to claim 50, wherein said second source/drain region of one of said plurality of said memory cells is connected to said second source/drain region of other ones of said plurality of said memory cells.

53. The semiconductor memory device according to claim 50, wherein said gate region of one of said plurality of said memory cells is connected to said gate region of other ones of said plurality of said memory cells.

54. The semiconductor memory device according to claim 50, comprising an additional metallization or metal track connecting said first source/drain region of one of said plurality of said memory cells to said first source/drain region of other ones of said plurality of said memory cells.

55. The semiconductor memory device according to claim 50, comprising an additional metallization or metal track connecting said second source/drain region of one of said plurality of said memory cells to said second source/drain region of other ones of said plurality of said memory cells.

56. The semiconductor memory device according to claim 50, comprising an additional metallization or metal track connecting said gate region of one of said plurality of said memory cells to said gate region of other ones of said plurality of said memory cells.

* * * * *